(12) United States Patent
Dray

(10) Patent No.: US 7,110,315 B2
(45) Date of Patent: Sep. 19, 2006

(54) SWITCH ARRANGEMENT FOR SWITCHING A NODE BETWEEN DIFFERENT VOLTAGES WITHOUT GENERATING COMBINATIONAL CURRENTS

(75) Inventor: Cyrille Dray, Eybens (FR)

(73) Assignee: STMicroelectronics S.A., Montrouge (FR)

( * ) Notice: Subject to any disclaimer, the term of this patent is extended or adjusted under 35 U.S.C. 154(b) by 201 days.

(21) Appl. No.: 10/929,359

(22) Filed: Aug. 27, 2004

(65) Prior Publication Data

US 2005/0077924 A1   Apr. 14, 2005

(30) Foreign Application Priority Data

Aug. 29, 2003   (FR) .................................... 03 10322

(51) Int. Cl.
*G11C 7/00* (2006.01)
*G11C 8/00* (2006.01)

(52) U.S. Cl. ................... 365/226; 365/189.08; 326/80; 326/81

(58) Field of Classification Search ................ 365/226, 365/189.08; 326/80, 68, 81
See application file for complete search history.

(56) References Cited

U.S. PATENT DOCUMENTS

| | | | |
|---|---|---|---|
| 5,764,572 A * | 6/1998 | Hammick | 365/189.01 |
| 5,923,585 A | 7/1999 | Wong et al. | |
| 6,049,498 A | 4/2000 | Chen | |
| 6,181,599 B1 | 1/2001 | Gongwer | |
| 6,249,458 B1 | 6/2001 | Shokouhi et al. | |
| 6,433,583 B1 * | 8/2002 | Micheloni et al. | 326/80 |

FOREIGN PATENT DOCUMENTS

EP   0 856 851   8/1998

* cited by examiner

*Primary Examiner*—Son T. Dinh
(74) *Attorney, Agent, or Firm*—Lisa K. Jorgenson; Stephen Bongini; Fleit, Kain, Gibbons, Gutman, Bongini & Bianco P.L.

(57) ABSTRACT

A switch arrangement for switching a node between three supply voltages based on two control signals. The switch arrangement includes three circuits for connecting an output node with one of three nodes, each of which is set to a different voltage. The switch arrangement is controlled by six control signals that establish mutually exclusive switching modes and avoid combinational currents. The switch arrangement is also designed to allow the use of MOS transistors having a low nominal voltage, with a value that is lower than the highest voltage to be switched. The switch arrangement is particularly adapted to supply power to non-volatile memory cells.

22 Claims, 5 Drawing Sheets

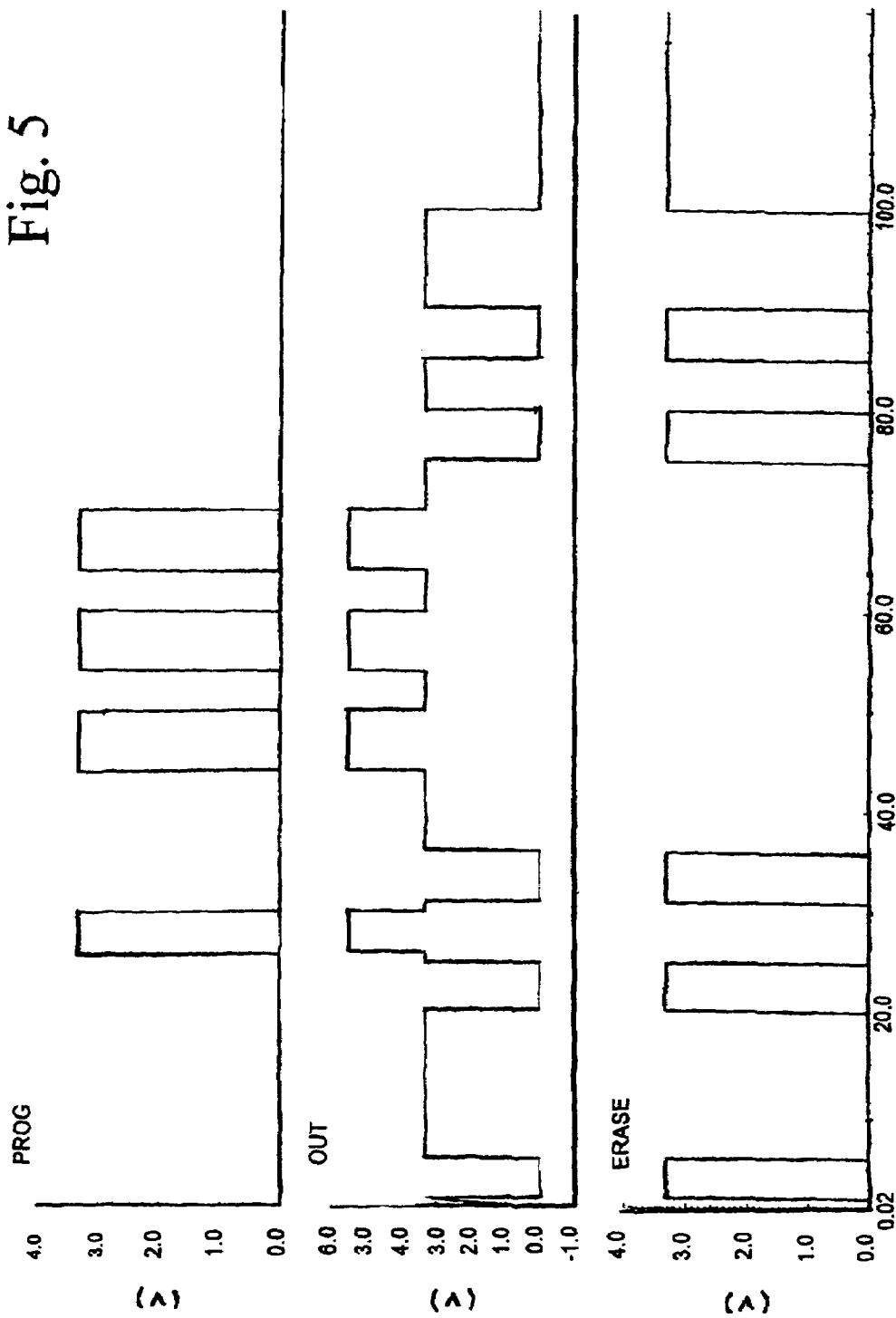

US 7,110,315 B2

SWITCH ARRANGEMENT FOR SWITCHING A NODE BETWEEN DIFFERENT VOLTAGES WITHOUT GENERATING COMBINATIONAL CURRENTS

CROSS-REFERENCE TO RELATED APPLICATIONS

This application is based upon and claims priority from French Patent Application No. 03-10322, filed Aug. 29, 2003, the entire disclosure of which is herein incorporated by reference.

FIELD OF THE INVENTION

The present invention relates to electronic circuits in general, and more particularly to a switch arrangement for switching an output node between several nodes having different voltages, without generating combinational currents.

BACKGROUND OF THE INVENTION

In many electronic circuits it is necessary to be able to switch a single node connected to a given load between different supply potentials or voltages.

FIG. 1a illustrates such a situation in which the same output node ($V_{out}$) is switched between several distinct supply voltages (i.e., voltage V33, voltage V55 or ground voltage). This is a very frequent case in electronics, and especially in the context of FLASH/EEPROM memories. As shown, three switches 1, 2 and 3 are used to switch the output node to one of three supply voltages.

In operating mode it is essential that short-circuits between supply voltages be prevented, since short-circuits generate combinational currents such as illustrated by currents I1 and I2 in FIG. 1a.

Such combinational currents are particularly prejudicial. First, they lead to a considerable increase in power consumption that makes it impossible to realize portable battery powered applications. Second, they cause components to overheat, which heat must be evacuated from the semiconductor. Third, they may cause the output voltage $V_{out}$ to temporarily drop, which might impede the operation of the circuit. Actually, considering the transitory voltage drop shown in FIG. 1b, and supposing that the output node is used to set the voltage of a MOS transistor bulk, it is clear that any limited voltage drop can cause a normally reverse-biased N-P junction to switch to direct mode.

Consequently, much effort is made to prevent short-circuits between the power sources and to ensure that the three current paths enabled by switches 1, 2 and 3 are exclusively controlled.

U.S. Pat. No. 6,433,583, entitled "CMOS SWITCH CIRCUIT FOR TRANSFERRING HIGH VOLTAGES, IN PARTICULAR FOR LINE DECODING IN NON VOLATILE MEMORIES, WITH REDUCED CONSUMPTION DURING SWITCHING", describes a switch used in a FLASH memory for switching two distinct voltages on a single node.

In the environment of non-volatile memories in particular, it is desirable to enable switching of at least three separate voltages on the same output node, while ensuring the complete absence of any combinational current.

In addition, it is desirable to realize such a switching circuit using MOS components having a nominal operating voltage that is limited and, in any case, lower than the highest value of the supply voltages to be switched. The aforementioned U.S. Patent does not address this issue.

SUMMARY OF THE INVENTION

One object of the present invention is to provide a switching circuit for switching a plurality of distinct voltages to a single output node while preventing combinational currents from being generated during such switching.

A further object of the present invention is to provide a switching circuit for commuting three separate voltages on a single output node while ensuring exclusive switching.

Another object of the present invention is to realize a switch that is particularly suited for supplying voltage to non-volatile memory cells, by preventing combinational currents from being generated during switching.

Yet another object of the present invention is to realize a switch for a non-volatile memory based on transistors having a nominal voltage that is lower than the highest value of the voltages to be switched.

One embodiment of the present invention provides a switching device for coupling an output node to a first node, a second node or a third node based on first and second control signals. The switching device includes a first circuit connecting the output node with the first node, a second circuit connecting the output node with the second node, a third circuit connecting the output node with the third node, a fourth circuit, a fifth circuit receiving the second, fifth and sixth control signals, a first translator block receiving a first logical control information, and a second translator block receiving a second logical control information. The first circuit includes a first transistor and a second transistor coupled in series, with the second transistor being controlled by a third control signal. The second circuit includes a third transistor and a fourth transistor, with the third transistor being controlled by a fourth control signal and the fourth transistor being controlled by the fifth control signal. The third circuit includes at least a fifth transistor and a sixth transistor, with the fifth transistor being controlled by the sixth control signal. The fourth circuit generates the third and fourth control signals from the first control signal so as to be mutually exclusive, and the fifth circuit generates the first and second logical control information. The first translator block generates the sixth control signal, and the second translator block generates the fifth control signal.

Another embodiment of the present invention provides an integrated circuit that includes at least one such switching device for coupling an output node to a first node, a second node or a third node.

Yet another embodiment of the present invention provides a non-volatile memory device that includes at least one such switching device for supplying power to the non-volatile memory cells by coupling an output node to a first node, a second node or a third node.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 5 illustrates timing diagrams for a switch according to one embodiment of the present invention.

DETAILED DESCRIPTION OF PREFERRED EMBODIMENTS

Figure 1A:
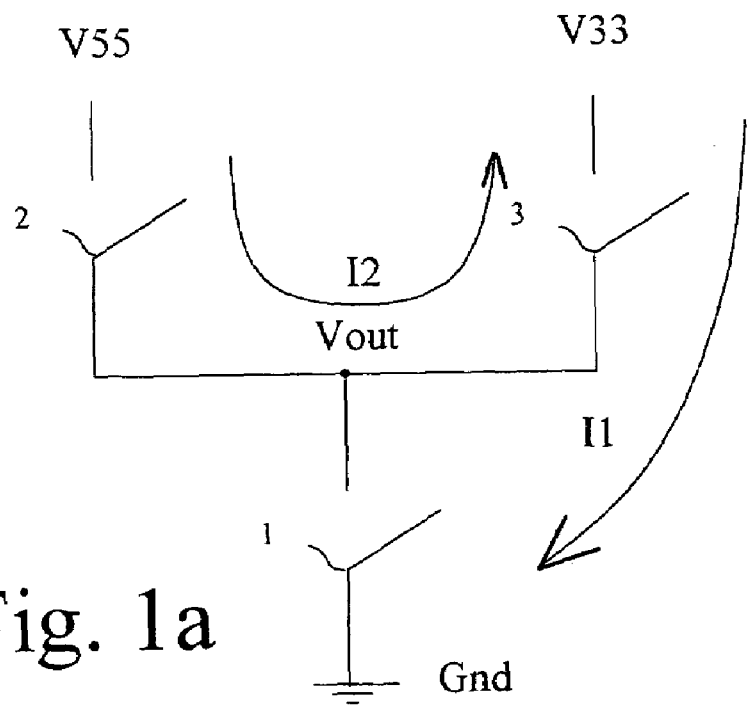
FIGS. 1a and 1b illustrate the switching of distinct voltages on a single node and the voltage drop caused by combinational currents, respectively.
Figure 1B:
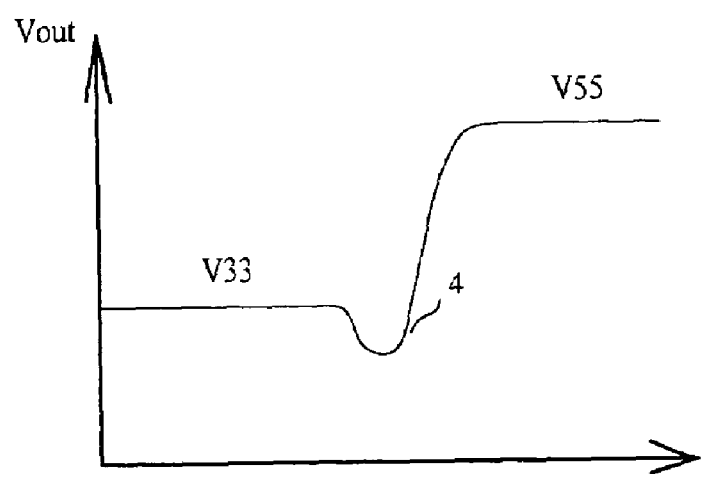

Preferred embodiments of the present invention provide a switching arrangement that makes it possible to switch an output node to a first, a second and a third node set to a first, a second and a third voltage, respectively, using first and second control signals.

In one embodiment, the switching arrangement comprises a first circuit for connecting the output node to the first node set to the first voltage, a second circuit for connecting the output node to the second node set to the second voltage, and a third circuit for connecting the output node to the third node set to the third voltage. The first circuit comprises at least first and second serially connected transistors, with the second transistor being controlled by a third control signal, and the second circuit comprises at least a third and a fourth transistor controlled by a fourth control signal and a fifth control signal, respectively. The third circuit comprises at least a fifth and a sixth transistor, with the fifth transistor being controlled by a sixth control signal. The third and fourth control signals are generated in an exclusive manner so as to exclusively set the second and third transistors to conduct. The switching arrangement further comprises an additional circuit that generates first and second logical control information signals from the second, fifth, and sixth control signals. Additionally, a first translator block receives the first logical information Z1 and generates the sixth control signal used for controlling the fifth transistor, and a second translator block receives the second logical information Z2 and generates the fifth control signal used for controlling the fourth transistor.

Thus, a switching operation generating no combinational current is carried out, which reduces the circuit's overall power consumption and further helps to protect it against supply voltage drops.

In a preferred embodiment, the transistors used are NMOS transistors and the first transistor has a gate electrode that receives a reference voltage for distributing the voltage difference between the first and second transistors, so as to allow the use of low operating voltage transistors.

Preferably, the sixth transistor also has a gate electrode that receives a reference voltage for distributing the voltage difference between the fifth and sixth transistors.

In one embodiment, the circuit generating the first and the second logical control information signals comprises first and second NAND gates, means for detecting switching of the fifth control signal, and means for detecting switching of the sixth control signal. The first NAND gate has a first input connected to the output of a first inverter that receives the second control signal, and generates the second logical control information signal. The second NAND gate receives the second control signal and generates the first logical control information signal. The means for detecting switching of the fifth control signal generates a high signal transmitted to a second input of the second NAND gate, and the means for detecting switching of the sixth control signal generates a high signal transmitted to a second input of the first NAND gate.

Figure 2:
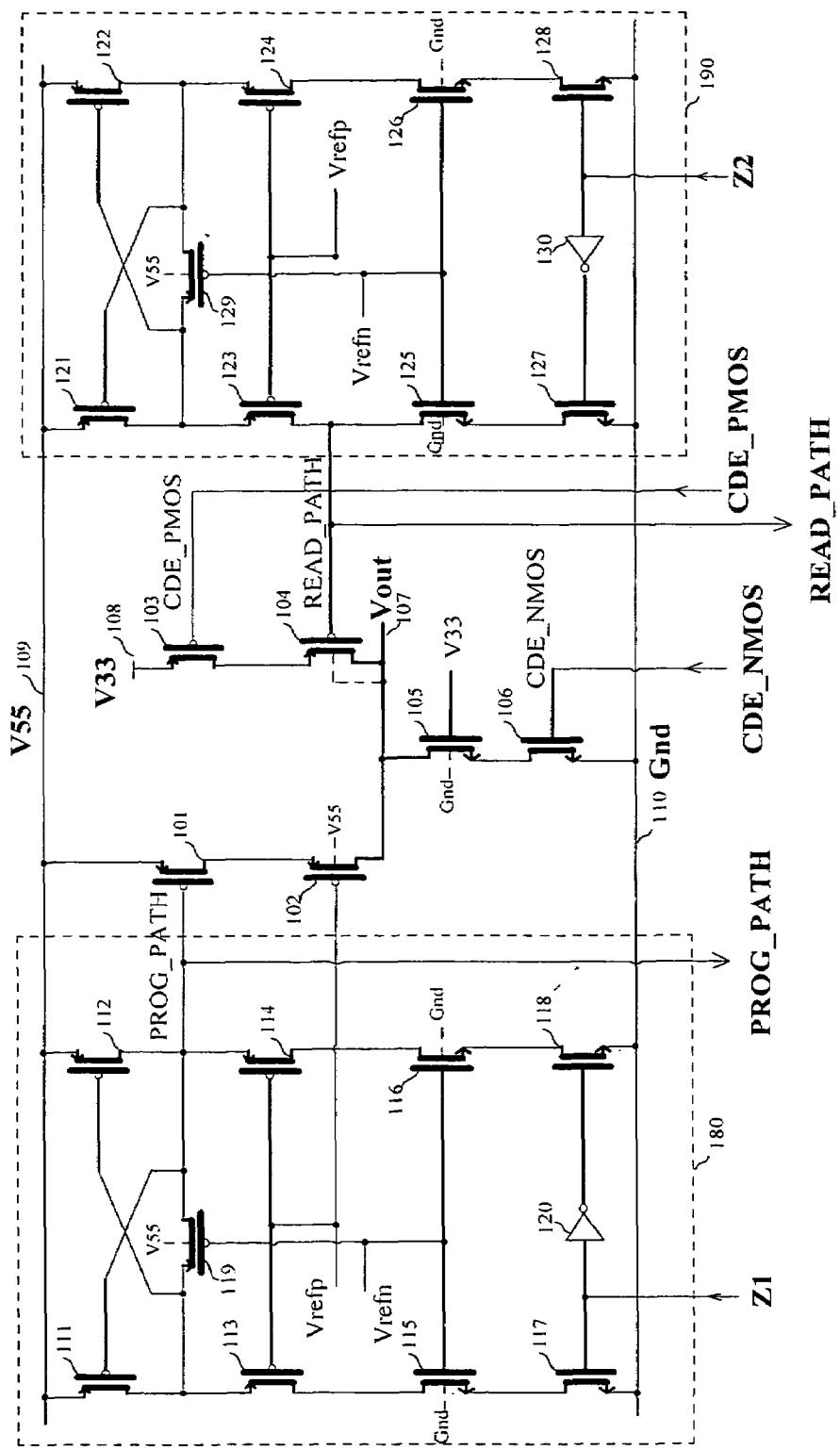
FIG. 2 illustrates a switch according to a preferred embodiment of the present invention.

FIG. 2 illustrates a switch according to a preferred embodiment of the present invention. The switch switches any of first, second and third supply voltages provided on nodes 110 (GND), 108 (V33) and 109 (V55), respectively, to an output node 107 having an output voltage $V_{out}$. The value of the third voltage V55 is greater than the nominal voltage allowed by the MOS transistor technology used to realize the switching circuit. In the preferred embodiment, the first voltage GND is set to 0 Volt, while the second voltage V33 is set to 3.3 V and the third voltage V55 is set to 5.5 V. Clearly, the circuit can be easily adapted to other voltage values required by specific applications (as long as the relationship $V55 < 2 \times V33$ is satisfied).

The circuit shown in FIG. 2 is particularly adapted to supply power to a non-volatile memory cell (such as a FLASH memory) that needs different voltages depending on whether erasing or programming is occurring. In this respect, the control circuit receives control signals PROG and ERASE that are particularly explicit in the context of non-volatile memory cell power supply. However, such a context is just an example of one embodiment among many possible embodiments and the switching circuit according to the present invention may be used whenever there exists a need to switch several different voltages on a single node, without generating any combinational current, while using MOS transistors having a relatively low nominal voltage.

Unless otherwise indicated, all MOS transistors are connected so that their bulk electrode is connected to the source voltage.

The switch includes a first set of NMOS transistors 105 and 106 that are connected together in series. Transistor 106 has a source electrode connected to the node 110 supplying the first voltage GND (i.e., ground) and a drain connected to the source of transistor 105, whose drain electrode is connected to the output node 107 ($V_{out}$) of the switch. The gate electrodes of transistors 105 and 106 respectively receive voltage V33 and a control signal CDE_NMOS, which is generated by the circuit of FIG. 4 as described below. Transistor 105 is used to cause voltage to drop in order to reduce the voltage received by transistor 106.

The switch has a second set of PMOS transistors 103 and 104 assembled in series. Transistor 103 has a source connected to the node 108 supplying the second voltage V33 and a drain connected to the source of PMOS transistor 104. The drain electrode and bulk electrode of transistor 104 are connected to output node 107 ($V_{out}$). Transistors 103 and 104 are controlled by voltages CDE_PMOS and READ_PATH that are received by their gate electrodes, respectively. The difference between the most extreme voltages is distributed between both transistors 103 and 104 so that each transistor only receives a voltage that is equal to or lower than its nominal value (i.e., only 3.3 Volts).

The switch also includes a third set of PMOS transistors 101 and 102, mounted in series. Transistor 101 has a source connected to node 109 supplying the third voltage V55 and a drain electrode connected to the source of PMOS transistor 102 that has a drain connected to the output node 107 ($V_{out}$) of the switch. The bulk electrode of transistor 102 is set to voltage V55. The gate electrodes of transistors 101 and 102 receive a voltage PROG_PATH and a reference voltage Vrefp, respectively. Transistor 102 allows the voltage difference at the terminals of transistor 101 to be reduced so that the transistor only receives a voltage that is equal to or lower than its nominal value (i.e., only 3.3 Volts).

Figure 3:
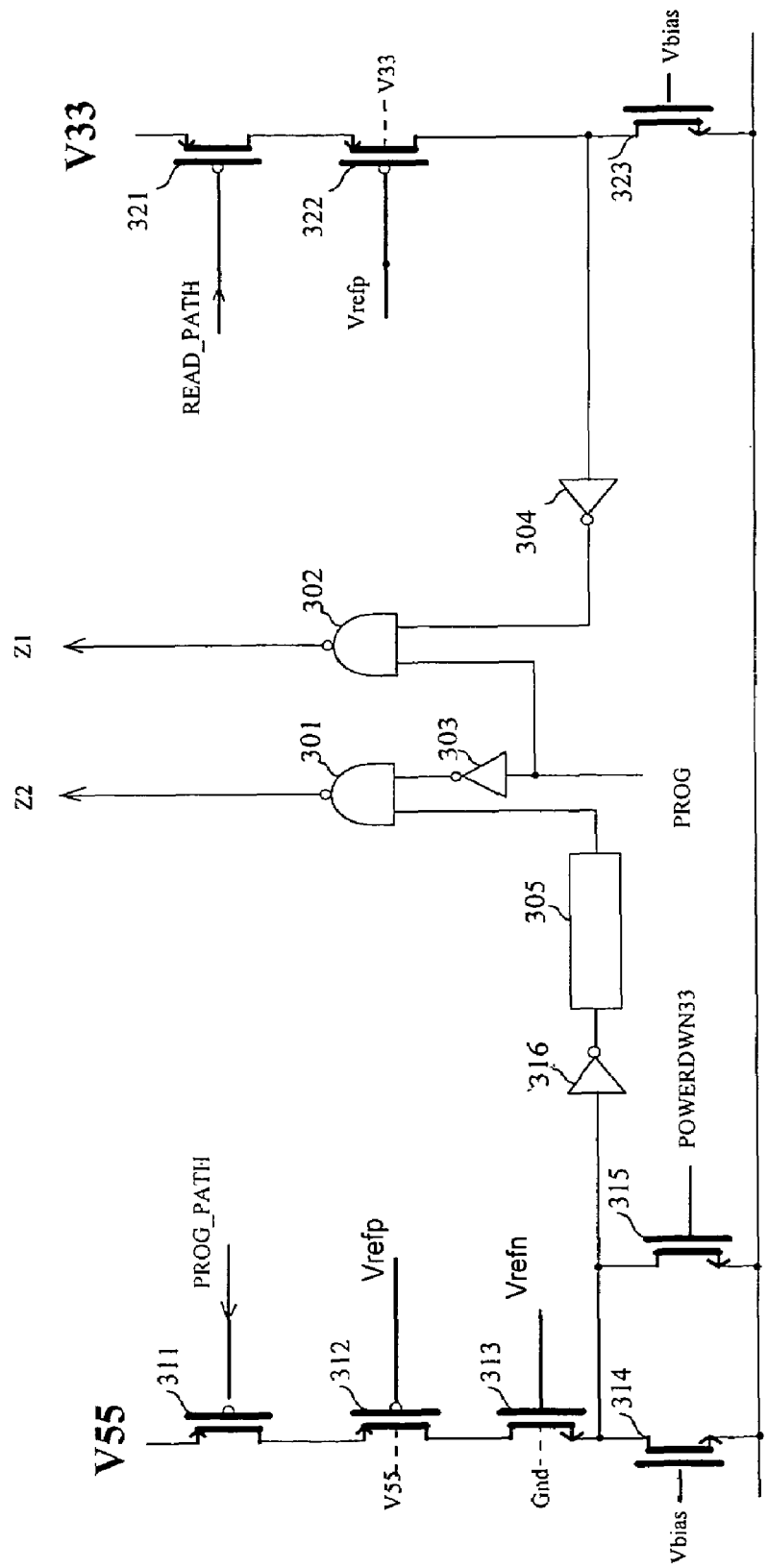
FIG. 3 illustrates an exemplary structure for a circuit for generating control signals Z1 and Z2.

The switch according to the present invention further includes a first voltage translator block 180 and a second voltage translator block 190 for respectively generating, from logical control information Z1 and Z2 generated by the circuit of FIG. 3, control voltages PROG_PATH and READ_PATH transmitted to the gate electrodes of transistors 101 and 104, respectively.

Block 180 comprises a first branch made up of the serial assembly of two PMOS transistors 111 and 113 and two NMOS transistors 115 and 117. Transistor 111 has a source connected to voltage V55 and a drain connected to the source of transistor 113, whose drain is connected to the drain of transistor 115. Transistor 115 has a bulk electrode connected to ground and a source connected to the drain of transistor 117, whose source is connected to ground.

Symmetrically, block 180 comprises a second branch made up of the serial assembly of two PMOS transistors 112 and 114 and two NMOS transistors 116 and 118. Transistor 112 has a source connected to voltage V55 and a drain connected to the source of transistor 114, whose drain is connected to the drain of transistor 116. Transistor 116 has a bulk electrode connected to ground and a source connected to the drain of transistor 118, whose source electrode is connected to ground.

The gate electrodes of transistors 111 and 112 are respectively connected to the middle point of transistors 112 and 114 and to the middle point of transistors 111 and 113. A PMOS transistor 119 has a source electrode connected to the middle point of transistors 111 and 113, a drain electrode connected to the middle point of transistors 112 and 114, and further has a bulk electrode set to voltage V55. The gate electrodes of transistors 115, 116 and 119 are connected to a reference voltage Vrefn.

The gate electrodes of transistors 113 and 114 are connected to a reference voltage Vrefp (close to 2.2V in the preferred embodiment) and to the gate of transistor 102.

The second voltage translator block 190 comprises two branches that are absolutely identical to the branches making up block 180 as described above. Elements 111–119 of block 180 correspond to elements 121–129 of block 190. The only difference between blocks 180 and 190 is that in block 180 control signal Z1 is transmitted to the gate electrode of transistor 117 and, via an inverter 120, to the gate of transistor 118, whereas in block 190 control signal Z2 is transmitted to the gate of transistor 128 and, via an inverter 130, to the gate of transistor 127.

The control signal PROG_PATH, which is transmitted to the gate of transistor 101, is generated by the voltage of the source electrode of transistor 114 (also connected to the drain of transistor 112), while control signal READ_PATH, which is transmitted to the gate of transistor 104, is generated by the drain electrode of transistor 123 (also connected to the drain of transistor 125).

FIG. 3 illustrates an exemplary circuit for generating logical control information signals Z1 and Z2 from command PROG and the conduction state of transistors 101 and 104.

The circuit of FIG. 3 comprises a first branch including, in serial assembly, two PMOS transistors 311 and 312 and two NMOS transistors 313 and 314. Transistor 311 has a source electrode receiving voltage V55, a gate electrode receiving voltage PROG_PATH and a drain electrode connected to the source electrode of transistor 312. Transistor 312 has a bulk electrode set to voltage V55 and a drain connected to the drain of transistor 313. Transistor 313 has a bulk electrode connected to ground, a gate connected to voltage Vrefn and a source connected to the drain of transistor 314, with transistor 314 being assembled as a current source and having a source electrode connected to ground and a gate electrode receiving a reference voltage Vbias. The voltage of the gate of transistor 312 is set to voltage Vrefp.

The circuit for generating signals Z1 and Z2 further comprises a second branch including, mounted in series, two PMOS transistors 321 and 322 and one NMOS transistor 323 mounted as a current source. The source electrode of transistor 321 is connected to voltage V33 and its drain is connected to the source of transistor 322. Transistor 322 has a bulk electrode connected to voltage V33 and a drain connected to the drain of transistor 323 and to an input to an inverter 304. Transistor 323 has a source connected to ground and a gate receiving a reference voltage Vbias. The gate electrodes of transistors 321 and 322 receive voltage READ_PATH and reference voltage Vrefp, respectively.

The drain of transistor 314 is connected to the input of an inverter 316 and to the drain of a transistor 315, which transistor has a source connected to ground and a gate receiving a control voltage POWERDWN33. Inverter 316 outputs a signal that is transmitted, via a voltage translator block 305, to a first input of a NAND gate 301, whose second input is connected to the output of an inverter 303 that receives a control signal PROG. Inverter 316 is fed with a voltage equal to or lower than V33-Vtn (i.e., 2.2 Volts in the preferred embodiment). Then, translator block 305 converts the logical level from inverter 316 into a logical level compatible with NAND gate 301.

Optional translator block 305 permits interfacing of the different voltage levels between the first branch of the circuit of FIG. 3 (typically ranging from 0 to 2.4 Volts) and the logical signal levels of NAND gate 301.

Similarly, the drain of transistor 323 is connected to the input of the inverter 304 that outputs a signal that is transmitted to a first input of a second NAND gate 302 (this time, without any in-between offset block), and the NAND gate 302 has a second input receiving control signal PROG.

NAND gates 301 and 302 output control logical signals Z2 and Z1, respectively.

Figure 4:
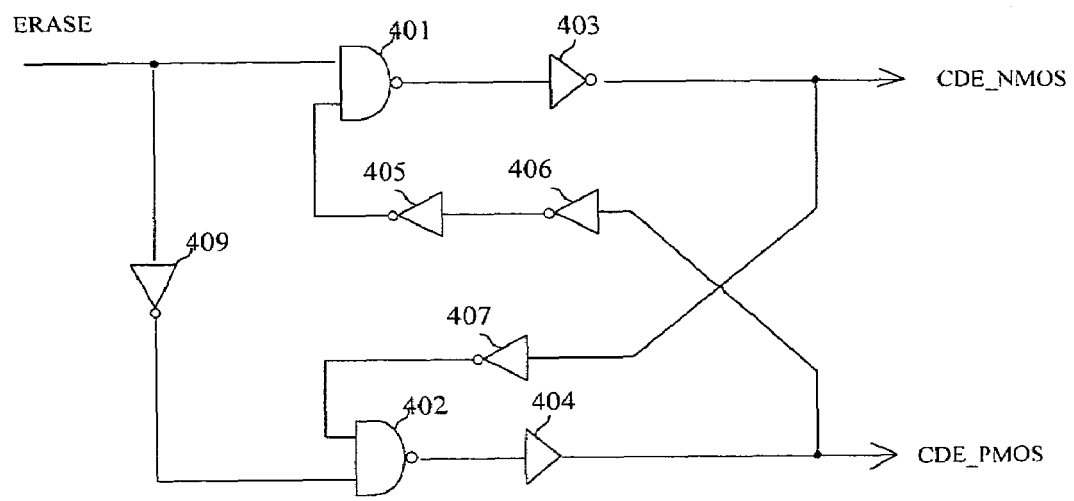
FIG. 4 illustrates an exemplary structure for a circuit generating signals CDE_NMOS and CDE_PMOS.

FIG. 4 illustrates a diagram of an exemplary circuit for generating, from a single control signal ERASE (commanding the output node to switch to the first voltage GND), mutually exclusive control signals CDE_NMOS and CDE_PMOS that are transmitted to the gate of transistor 106 and the gate of transistor 103, respectively.

A first NAND gate 401 has a first input receiving control signal ERASE (causing node 107 to fall to voltage GND) and an output connected to the input of an inverter 403 that outputs signal CDE_NMOS. Signal CDE_NMOS is also transmitted to the input of an inverter 407 that has an output connected to a first input of a NAND gate 402, whose second input receives signal ERASE via an inverter 409. NAND gate 402 has an output connected to the input of an optional buffer 404 that outputs control signal CDE_PMOS. Signal CDE_PMOS is transmitted to a second input of NAND gate 401 via two inverters 405 and 406 assembled in series. The circuit of FIG. 4 generates two signals CDE_NMOS and CDE_PMOS that are completely exclusive.

The operation of a switch according to the preferred embodiment of the present invention will now be described, with reference to the timing diagrams of FIG. 5.

Generally, the circuit of FIG. 3 monitors control voltages PROG_PATH and READ_PATH (and the conduction state of the corresponding MOS transistors) in order to check circuit positioning before closing another one. While blocking a transistor is an operation that is carried out immediately, setting a transistor (e.g., 103) to conduction can only be done once it has been checked that the opposite transistor (e.g., 106) is blocked. Such conduction state detection is advantageously provided by voltage detection instead of current detection, in order to ensure the circuit is reliable even when no load is connected to output node 107 $V_{out}$.

Let us suppose a case where the previous command was an erase command during which node 107 was set to ground voltage GND.

During the erase cycle, transistors 104, 105 and 106 are conductive and transistor 103 is blocked, maintaining voltage $V_{out}$ at the voltage of node 110. At the end of the erase command, the level of signal ERASE drops. The level of signal PROG is low too.

The transition of signal ERASE to a low state causes signal CDE_NMOS to enter a low state, thus causing transistor 106 to be immediately blocked. It can therefore be noted that node 107 is immediately decoupled from the first voltage GND in a priority manner, and without generating any combinational current since disabling a MOS transistor causes no combinational current.

Furthermore, the circuit of FIG. 4 renders the command for enabling transistor 103 dependent on the disabling of transistor 106. Indeed, as can be seen in FIG. 4, signal CDE_PMOS can only reach a low level once signal CDE_NMOS has itself reached a low level. This ensures that only one of transistors 103 and 106 is conductive and, as a result, that no combinational current occurs between the first voltage GND and the second voltage V33.

Consequently, output node 107 is connected to node 108 and the value of the output voltage $V_{out}$ is set to the value of the second voltage V33 and keeps this value as long as neither control signal ERASE nor PROG is high. By default, when neither signal PROG nor ERASE is high, output node 107 is thus connected to node 108 via transistors 103 and 104 that are enabled (i.e., set to voltage V33).

Node 107 being set to voltage V33, if signal ERASE were to be high again, the circuit of FIG. 4 would then immediately block transistor 103, thus ensuring transistor 106 is conducting. In the context of a non-volatile memory power supply, it would amount to going back to an erase cycle.

Let us now consider the most interesting case: a programming command occurring in the default state, where the output node is switched to voltage V33. In such a case, control signal PROG goes high, causing a low state at the output of inverter 303, and therefore, immediate switching of NAND gate 301 to a high level, thus transmitting the corresponding information Z2 to translator block 190. Information signal Z1 is translated by block 190 to generate information signal READ_PATH with a voltage ranging between GND and V55. Indeed, referring again to FIG. 2 it can be seen that signal Z2 is inverted by inverter 130 and thus causes transistor 127 to be blocked and all of the first branch of block 190 to switch. Transistors 121 and 123 are enabled, bringing voltage READ_PATH to the value of V55. As shown, signals Z2 and READ_PATH move in the same direction but with different amplitudes. When signal Z2 is high, signal READ_PATH is set to voltage V55. Transistor 104 is therefore blocked, thus opening the connection between node 107 and node 108, which is at voltage V33.

Transistor 103 is still enabled since, from state V33, transistor 106 was blocked. Therefore, mutually exclusive controls CDE_NMOS and CDE_PMOS manage the conduction state of transistor 103 when transistor 106 is blocked.

The state of voltage READ_PATH is transmitted to the gate of transistor 321 and this voltage rising up to V55 causes transistor 321 to be disabled. Since transistor 323 is mounted as a current source (its gate being set to a reference voltage), when transistor 321 is blocked it causes the input of inverter 304 to be set to ground. The output of inverter 304 is high, which then allows command PROG to be taken into account via NAND gate 302 and information signal Z1 becomes low at the output of the NAND gate.

Information signal Z1 is then transmitted to the gate of transistor 117 and to the gate of transistor 118 via inverter 120. Transistors 118, 116 and 114 are conducting. Voltage PROG_PATH then becomes equal to Vrefp+|Vtp| (Vtp being the threshold voltage of a MOS transistor), thus causing transistor 101 to conduct, which sets the voltage of node 107 to V55 thus reversing polarity on the terminals of the source and drain electrodes of transistor 104. For this reason V55 was brought to the gate of transistor 104 in order to ensure blocking thereof. Transistor 102, which is conducting because of reference voltage Vrefp on its gate, permits voltage distribution between both transistors' terminals in order to allow the circuit to operate even with 3.3V transistors only. For that reason transistor 102 is biased to a voltage Vrefp that is set to 2.2 volts in order to ensure that voltage differences at the transistor's terminals are equal to or lower than the nominal voltage for this technology.

Output voltage $V_{out}$ thus goes to the value set by the third voltage V55, and once again, with no combinational current being generated. It should be further noted that in block 180, signals Z1 and PROG_PATH have similar waves, but with different voltage amplitudes. Signal PROG_PATH varies from Vrefp+|Vtp| to V55 while signal Z2 varies within a smaller range, from 0 to V33.

When information signal PROG falls again to 0 level, it causes immediate (because of priority) switching of NAND gate 302, which generates an output information signal Z1 having a high level that makes transistor 112 conductive, thus causing voltage PROG_PATH to rise to V55 and, as a consequence, quickly disable transistor 101.

Voltage PROG_PATH rising to V55 causes transistor 311 to be blocked. Transistor 314 being assembled as a current source, its drain drops to zero voltage, which causes a high level on the output of inverter 316 and therefore, a corresponding high level on the first input of NAND gate 301 via voltage translator circuit 305. Voltage variation on the drain of transistor 314 is only 2.4 Volts, which can justify the use of translation circuit 305 in order to present reasonable voltage levels to the input of NAND gate 301.

Signal PROG being equal to zero too, NAND gate 301 therefore outputs a logical level 0 for information Z2, which information is then transmitted to block 190. Transistors 127 and 125 are then conducting and voltage READ_PATH is low, which leads to conduction of transistor 104. Transistor 103 being conductive also (since transistor 106 is disabled), output node $V_{out}$ is therefore set to voltage V33 with no risk of generating combinational currents from the different existing currents.

It is now easy to note that, if signal ERASE transitions to state 1, it will cause immediate disabling of transistor 103 (and correlatively, it will set transistor 106 to conduction) because of the circuit of FIG. 4, and more particularly because of NAND gate 402 whose output will reach a high state. NAND gate 401 having high levels on both its inputs causes a high level control signal CDE_NMOS, which then leads to conduction of transistor 106.

Thus, output voltage $V_{out}$ is set to the value of the first voltage GND, which is ground.

Accordingly, switching with no overlapping or combinational current between voltages GND, V33 and V55 is achieved. As a result, power consumption is reduced, and furthermore, voltage drops that could interfere with electronic circuit operation are limited.

The switch according to the preferred embodiment of the present invention has an architecture for carrying out such switching using 3.3V MOS components, with no need to expose such components to detrimental stresses due to switching of a 5.5V voltage on the output node. This ensures that switches—that are much more tried than FLASH-type memory cells—are always operating within their nominal voltage range, which consequently protects their life span.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A switching device for coupling an output node to a first node, a second node or a third node, the switching device being controlled by first and second control signals, the switching device comprising:
    a first circuit connecting the output node with the first node, the first circuit comprising at least a first transistor and a second transistor coupled in series, the second transistor being controlled by a third control signal;
    a second circuit connecting the output node with the second node, the second circuit comprising at least a third transistor and a fourth transistor, the third transistor being controlled by a fourth control signal and the fourth transistor being controlled by a fifth control signal;
    a third circuit connecting the output node with the third node, the third circuit comprising at least a fifth transistor and a sixth transistor, the fifth transistor being controlled by a sixth control signal;
    a fourth circuit generating the third and fourth control signals from the first control signal, the third and fourth control signals being generated so as to be mutually exclusive;
    a fifth circuit receiving the second, fifth and sixth control signals and generating first and second logical control information;
    a first translator block receiving the first logical control information and generating the sixth control signal; and
    a second translator block receiving the second logical control information and generating the fifth control signal.

2. The switching device according to claim 1,
    wherein the first through sixth transistors are MOS transistors, and
    the first transistor has a gate electrode that receives a first reference voltage for distributing the voltage difference between the first and second transistors.

3. The switching device according to claim 2, wherein the sixth transistor has a gate electrode that receives a second reference voltage for distributing the voltage difference between the fifth and sixth transistors.

4. The switching device according to claim 3, wherein the fifth circuit comprises:
    a first inverter receiving the second control signal;
    a first NAND gate having a first input connected to the output of the first inverter, and an output generating the second logical control information;
    a second NAND gate having a first input receiving the second control signal, and an output generating the first logical control information;
    a first detection circuit for detecting switching of the fifth control signal and generating a signal that is coupled to a second input of the second NAND gate; and
    a second detection circuit for detecting switching of the sixth control signal and generating a signal that is coupled to a second input of the first NAND gate.

5. The switching device according to claim 4, wherein the first translator block comprises:
    a first branch including a seventh PMOS transistor, an eighth PMOS transistor, a ninth NMOS transistor and a tenth NMOS transistor coupled in series between the first and third nodes, a gate of the tenth transistor receiving the first logical control information;
    a second branch including an eleventh PMOS transistor, a twelfth PMOS transistor, a thirteenth NMOS transistor and a fourteenth NMOS transistor coupled in series, a gate of the fourteenth transistor receiving the inverse of the first logical control information; and
    a fifteenth transistor having a source electrode connected to a gate of the eleventh transistor, a drain connected to a gate of the seventh transistor, and a gate connected to gates of the ninth and thirteenth transistors,
    wherein the gate of the seventh transistor is connected to a middle point of the eleventh and twelfth transistors,
    the gate of the eleventh transistor is connected to a middle point of the seventh and eighth transistors,
    gates of the eighth and twelfth transistors are connected to the gate of the sixth transistor, and
    a middle point of the eleventh and twelfth transistors generates the sixth control signal.

6. The switching device according to claim 5, wherein the second translator block comprises:
    a first branch including a sixteenth PMOS transistor, a seventeenth PMOS transistor, an eighteenth NMOS transistor and a nineteenth NMOS transistor coupled in series between the first and third nodes, a gate of the nineteenth transistor receiving the inverse of the second logical control information;
    a second branch including a twentieth PMOS transistor, a twenty-first PMOS transistor, a twenty-second NMOS transistor and a twenty-third NMOS transistor, a gate of the twenty-third transistor receiving the second logical control information; and
    a twenty-fourth transistor having a source connected to a gate of the twentieth transistor, a drain connected to a gate of the sixteenth transistor, and a gate connected to gates of the eighteenth and twenty-second transistors,
    wherein the gate of the sixteenth transistor is connected to a middle point of the twentieth and twenty-first transistors,
    the gate of the twentieth transistor is connected to a middle point of the sixteenth and seventeenth transistors,
    gates of the seventeenth and twenty-first transistors are connected to the second reference voltage, and
    a middle point of the seventeenth and eighteenth transistors generates the fifth control signal.

7. The switching device according to claim 6, wherein the fourth circuit comprises:
  a first NAND gate having a first input receiving the first control signal and a second input coupled to the fourth control signal;
  a first inverter having an input connected to the output of the first NAND gate, and outputting the third control signal;
  a second inverter receiving the first control signal;
  a third inverter having an input receiving the third control signal; and
  a second NAND gate having a first input connected to the output of the second inverter and a second input connected to the output of the third inverter, the second NAND gate outputting the inverse of the fourth control signal.

8. The switching device according to claim 1, wherein the sixth transistor has a gate electrode that receives a second reference voltage for distributing the voltage difference between the fifth and sixth transistors.

9. The switching device according to claim 1, wherein the fifth circuit comprises:
  a first inverter receiving the second control signal;
  a first NAND gate having a first input connected to the output of the first inverter, and an output generating the second logical control information;
  a second NAND gate having a first input receiving the second control signal, and an output generating the first logical control information;
  a first detection circuit for detecting switching of the fifth control signal and generating a signal that is coupled to a second input of the second NAND gate; and
  a second detection circuit for detecting switching of the sixth control signal and generating a signal that is coupled to a second input of the first NAND gate.

10. The switching device according to claim 1, wherein the first translator block comprises:
  a first branch including a seventh PMOS transistor, an eighth PMOS transistor, a ninth NMOS transistor and a tenth NMOS transistor coupled in series between the first and third nodes, a gate of the tenth transistor receiving the first logical control information;
  a second branch including an eleventh PMOS transistor, a twelfth PMOS transistor, a thirteenth NMOS transistor and a fourteenth NMOS transistor coupled in series, a gate of the fourteenth transistor receiving the inverse of the first logical control information; and
  a fifteenth transistor having a source electrode connected to a gate of the eleventh transistor, a drain connected to a gate of the seventh transistor, and a gate connected to gates of the ninth and thirteenth transistors,
  wherein the gate of the seventh transistor is connected to a middle point of the eleventh and twelfth transistors,
  the gate of the eleventh transistor is connected to a middle point of the seventh and eighth transistors,
  gates of the eighth and twelfth transistors are connected to the gate of the sixth transistor, and
  a middle point of the eleventh and twelfth transistors generates the sixth control signal.

11. The switching device according to claim 1, wherein the fourth circuit comprises:
  a first NAND gate having a first input receiving the first control signal and a second input coupled to the fourth control signal;
  a first inverter having an input connected to the output of the first NAND gate, and outputting the third control signal;
  a second inverter receiving the first control signal;
  a third inverter having an input receiving the third control signal; and
  a second NAND gate having a first input connected to the output of the second inverter and a second input connected to the output of the third inverter, the second NAND gate outputting the inverse of the fourth control signal.

12. An integrated circuit including at least one switching device for coupling an output node to a first node, a second node or a third node, the switching device being controlled by first and second control signals, the switching device comprising:
  a first circuit connecting the output node with the first node, the first circuit comprising at least a first transistor and a second transistor coupled in series, the second transistor being controlled by a third control signal;
  a second circuit connecting the output node with the second node, the second circuit comprising at least a third transistor and a fourth transistor, the third transistor being controlled by a fourth control signal and the fourth transistor being controlled by a fifth control signal;
  a third circuit connecting the output node with the third node, the third circuit comprising at least a fifth transistor and a sixth transistor, the fifth transistor being controlled by a sixth control signal;
  a fourth circuit generating the third and fourth control signals from the first control signal, the third and fourth control signals being generated so as to be mutually exclusive;
  a fifth circuit receiving the second, fifth and sixth control signals and generating first and second logical control information;
  a first translator block receiving the first logical control information and generating the sixth control signal; and
  a second translator block receiving the second logical control information and generating the fifth control signal.

13. The integrated circuit according to claim 12,
  wherein the first through sixth transistors are MOS transistors,
  the first transistor has a gate electrode that receives a first reference voltage for distributing the voltage difference between the first and second transistors, and
  the sixth transistor has a gate electrode that receives a second reference voltage for distributing the voltage difference between the fifth and sixth transistors.

14. The integrated circuit according to claim 12, wherein the fifth circuit comprises:
  a first inverter receiving the second control signal;
  a first NAND gate having a first input connected to the output of the first inverter, and an output generating the second logical control information;
  a second NAND gate having a first input receiving the second control signal, and an output generating the first logical control information;
  a first detection circuit for detecting switching of the fifth control signal and generating a signal that is coupled to a second input of the second NAND gate; and
  a second detection circuit for detecting switching of the sixth control signal and generating a signal that is coupled to a second input of the first NAND gate.

15. The integrated circuit according to claim 12, wherein the first translator block comprises:
  a first branch including a seventh PMOS transistor, an eighth PMOS transistor, a ninth NMOS transistor and a tenth NMOS transistor coupled in series between the first and third nodes, a gate of the tenth transistor receiving the first logical control information;

a second branch including an eleventh PMOS transistor, a twelfth PMOS transistor, a thirteenth NMOS transistor and a fourteenth NMOS transistor coupled in series, a gate of the fourteenth transistor receiving the inverse of the first logical control information; and a fifteenth transistor having a source electrode connected to a gate of the eleventh transistor, a drain connected to a gate of the seventh transistor, and a gate connected to gates of the ninth and thirteenth transistors, wherein the gate of the seventh transistor is connected to a middle point of the eleventh and twelfth transistors, the gate of the eleventh transistor is connected to a middle point of the seventh and eighth transistors, gates of the eighth and twelfth transistors are connected to the gate of the sixth transistor, and a middle point of the eleventh and twelfth transistors generates the sixth control signal.

16. The integrated circuit according to claim 12, wherein the fourth circuit comprises:
a first NAND gate having a first input receiving the first control signal and a second input coupled to the fourth control signal;
a first inverter having an input connected to the output of the first NAND gate, and outputting the third control signal;
a second inverter receiving the first control signal;
a third inverter having an input receiving the third control signal; and
a second NAND gate having a first input connected to the output of the second inverter and a second input connected to the output of the third inverter, the second NAND gate outputting the inverse of the fourth control signal.

17. A non-volatile memory device including at least one switching device for supplying power to non-volatile memory cells by coupling an output node to a first node, a second node or a third node, the switching device being controlled by first and second control signals, the switching device comprising:
a first circuit connecting the output node with the first node, the first circuit comprising at least a first transistor and a second transistor coupled in series, the second transistor being controlled by a third control signal;
a second circuit connecting the output node with the second node, the second circuit comprising at least a third transistor and a fourth transistor, the third transistor being controlled by a fourth control signal and the fourth transistor being controlled by a fifth control signal;
a third circuit connecting the output node with the third node, the third circuit comprising at least a fifth transistor and a sixth transistor, the fifth transistor being controlled by a sixth control signal;
a fourth circuit generating the third and fourth control signals from the first control signal, the third and fourth control signals being generated so as to be mutually exclusive;
a fifth circuit receiving the second, fifth and sixth control signals and generating first and second logical control information;
a first translator block receiving the first logical control information and generating the sixth control signal; and
a second translator block receiving the second logical control information and generating the fifth control signal.

18. The non-volatile memory device according to claim 17,
wherein the first through sixth transistors are MOS transistors, and
the first transistor has a gate electrode that receives a first reference voltage for distributing the voltage difference between the first and second transistors.

19. The non-volatile memory device according to claim 18, wherein the sixth transistor has a gate electrode that receives a second reference voltage for distributing the voltage difference between the fifth and sixth transistors.

20. The non-volatile memory device according to claim 17, wherein the fifth circuit comprises:
a first inverter receiving the second control signal;
a first NAND gate having a first input connected to the output of the first inverter, and an output generating the second logical control information;
a second NAND gate having a first input receiving the second control signal, and an output generating the first logical control information;
a first detection circuit for detecting switching of the fifth control signal and generating a signal that is coupled to a second input of the second NAND gate; and
a second detection circuit for detecting switching of the sixth control signal and generating a signal that is coupled to a second input of the first NAND gate.

21. The non-volatile memory device according to claim 17, wherein the first translator block comprises:
a first branch including a seventh PMOS transistor, an eighth PMOS transistor, a ninth NMOS transistor and a tenth NMOS transistor coupled in series between the first and third nodes, a gate of the tenth transistor receiving the first logical control information;
a second branch including an eleventh PMOS transistor, a twelfth PMOS transistor, a thirteenth NMOS transistor and a fourteenth NMOS transistor coupled in series, a gate of the fourteenth transistor receiving the inverse of the first logical control information; and
a fifteenth transistor having a source electrode connected to a gate of the eleventh transistor, a drain connected to a gate of the seventh transistor, and a gate connected to gates of the ninth and thirteenth transistors,
wherein the gate of the seventh transistor is connected to a middle point of the eleventh and twelfth transistors,
the gate of the eleventh transistor is connected to a middle point of the seventh and eighth transistors,
gates of the eighth and twelfth transistors are connected to the gate of the sixth transistor, and
a middle point of the eleventh and twelfth transistors generates the sixth control signal.

22. The non-volatile memory device according to claim 17, wherein the fourth circuit comprises:
a first NAND gate having a first input receiving the first control signal and a second input coupled to the fourth control signal;
a first inverter having an input connected to the output of the first NAND gate, and outputting the third control signal;
a second inverter receiving the first control signal;
a third inverter having an input receiving the third control signal; and
a second NAND gate having a first input connected to the output of the second inverter and a second input connected to the output of the third inverter, the second NAND gate outputting the inverse of the fourth control signal.

* * * * *